United States Patent
Lilly et al.

(10) Patent No.: US 8,055,975 B2
(45) Date of Patent: Nov. 8, 2011

(54) COMBINED SINGLE ERROR CORRECTION/DEVICE KILL DETECTION CODE

(75) Inventors: Brian P. Lilly, San Francisco, CA (US); Robert Gries, Woodstock, CT (US); Sridhar P. Subramanian, Cupertino, CA (US); Sukalpa Biswas, Fremont, CA (US); Hao Chen, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 1190 days.

(21) Appl. No.: 11/758,322

(22) Filed: Jun. 5, 2007

(65) Prior Publication Data

US 2008/0307286 A1  Dec. 11, 2008

(51) Int. Cl.
    *H03M 13/00* (2006.01)
(52) U.S. Cl. .................. 714/758; 714/784; 714/785
(58) Field of Classification Search ............... 714/758, 714/784, 785
    See application file for complete search history.

(56) References Cited

U.S. PATENT DOCUMENTS

| | | | |
|---|---|---|---|
| 6,101,614 A * | 8/2000 | Gonzales et al. | 714/6 |
| 6,430,723 B2 * | 8/2002 | Kodama et al. | 714/770 |
| 6,973,613 B2 | 12/2005 | Cypher | |
| 6,986,095 B2 * | 1/2006 | Maeda et al. | 714/769 |
| 6,990,622 B2 * | 1/2006 | Davis et al. | 714/763 |
| 7,106,679 B2 * | 9/2006 | Sasaki et al. | 369/53.35 |
| 7,188,296 B1 * | 3/2007 | Cypher | 714/755 |

OTHER PUBLICATIONS

Mark Hayter, "Zen and the Art of SOC Design," Microprocessor Summit 2006, Session MPS-960 High End Processors, P.A. Semi, Inc., 14 pages.
James B. Keller, "The PWRficient Processor Family," PA Semi, Oct. 2005, 31 pages.

* cited by examiner

*Primary Examiner* — Esaw Abraham
(74) *Attorney, Agent, or Firm* — Lawrence J. Merkel; Meyertons, Hood, Kivlin & Goetzel, P.C.

(57) ABSTRACT

In one embodiment, an apparatus includes a check/correct circuit coupled to a control circuit. The check/correct circuit is coupled to receive a block of data and corresponding check bits. The block of data is received as N transmissions, each transmission including M data bits and L check bits. The check/correct circuit is configured to detect one or more errors in each of a plurality of non-overlapping windows of K bits in the M data bits, responsive to the M data bits and the L check bits. The control circuit is configured to record which of the plurality of windows have had errors detected and, if a given window of the plurality of windows has had errors detected in each of the N transmissions of the block, the control circuit is configured to signal a device failure. Each of K, L, M, and N are integers greater than one.

16 Claims, 5 Drawing Sheets

| |
|---|
| 15417801ee907b479ad6097b6b2c5242 |
| 2a82f002dd20f68e35ac12f7d658a485 |
| 40449980554d1965bf18e2c94c79d1b48 |
| 95c8480b473357f179ca5053e41664d3 |
| 3ed1e81760f6d4a46942a9dda3009be4 |
| 68e2a82f2f7dd20f48535ac12d2d658a |
| d1c5505e5efba41e90a6b5825a5acb14 |
| a38aa0bcbdf7483d214d6b04b4b59629 |
| 471541787bee907b429ad609696b2c52 |
| 8e2a82f0f7dd20f68535ac12d2d658a4 |
| 1c5505e0efba41ed0a6b5825a5acb149 |
| 38aa0bc0df7483da14d6b04b4b596292 |
| 71541780bee907b429ad609796b2c524 |
| e2a82f007dd20f68535ac12f2d658a48 |
| c5505e00fba41ed1a6b5825e5acb1490 |
| 8aa0bc00f7483da34d6b04bdb5962921 |

COMBINED SINGLE ERROR CORRECTION/DEVICE KILL DETECTION CODE

BACKGROUND

1. Field of the Invention

This invention is related to the field of error detection and correction codes.

2. Description of the Related Art

Error codes are commonly used in electronic systems to detect and correct data errors, such as transmission errors or storage errors. For example, error codes are used to detect and correct errors in data transmitted via any transmission medium (e.g. conductors and/or transmitting devices between chips in an electronic system, a network connect, a telephone line, a radio transmitter, etc.). Error codes are also used to detect and correct errors associated with data stored in the memory of computer systems. In such systems, error correction bits, or check bits, may be generated for the data prior to its transfer or storage. When the data is received or retrieved, the check bits may be used to detect and correct errors within the data.

Device failures are a common source of error in electrical systems. Faulty devices can include faulty memory chips or faulty data paths provided between devices of a system. Faulty data paths can result from, for example, faulty pins, faulty data traces, or faulty wires. Additionally, memory modules, which often contain multiple memory chips, can fail. Circuitry which drives the data paths can also fail.

Another source of error in electrical systems are so-called "soft" or "transient errors". A transient memory error is caused by the occurrence of an event, rather than a defect in the memory/transmission circuitry itself. Transient memory errors can occur due to, for example, random alpha particles striking the memory circuit. Transient communication errors can occur due to noise on the data paths, inaccurate sampling of the data due to clock drift, etc. On the other hand, "hard" or "persistent" errors occur due to device failure.

Generally, various error detection code (EDC) and error correction code (ECC) schemes are used to detect and correct memory and/or communication errors. For example, parity can be used. With parity, a single parity bit is stored/transmitted for a given set of data bits, representing whether the number of binary ones in the data bits is even or odd. The parity is generated when the set of data bits is stored/transmitted and is checked when the set of data bits is accessed/received. If the parity doesn't match the accessed set of data bits, then an error is detected.

Other EDC/ECC schemes assign several check bits per set of data bits. In a typical code (e.g. a Hamming code or related code types), the check bits are encoded from various overlapping combinations of the corresponding data bits. The encodings are selected such that a bit error or errors can be detected, and in some cases the encodings are selected such that the bit or bits in error are identifiable so that the error can be corrected (depending on the number of bits in error and the scheme being used). Another EDC scheme is a cyclic redundancy code (CRC) scheme. With a typical CRC scheme, errors in the data can be detected but not corrected. Typically, as the number of bit errors that can be detected and/or corrected increases, the number of check bits used in the scheme increases as well.

SUMMARY

In one embodiment, an apparatus comprises a check/correct circuit coupled to a control circuit. The check/correct circuit is coupled to receive a block of data and corresponding check bits. The block of data is received as N transmissions, each transmission comprising M data bits and L check bits. The check/correct circuit is configured to detect one or more errors in each of a plurality of non-overlapping windows of K bits in the M data bits, responsive to the M data bits and the L check bits. The control circuit is configured to record which of the plurality of windows have had errors detected and, if a given window of the plurality of windows has had errors detected in each of the N transmissions of the block, the control circuit is configured to signal a device failure. Each of K, L, M, and N are integers greater than one.

BRIEF DESCRIPTION OF THE DRAWINGS

The following detailed description makes reference to the accompanying drawings, which are now briefly described.

FIG. 5 is a block diagram of one embodiment of a matrix for a CRC code.

Figure 1:
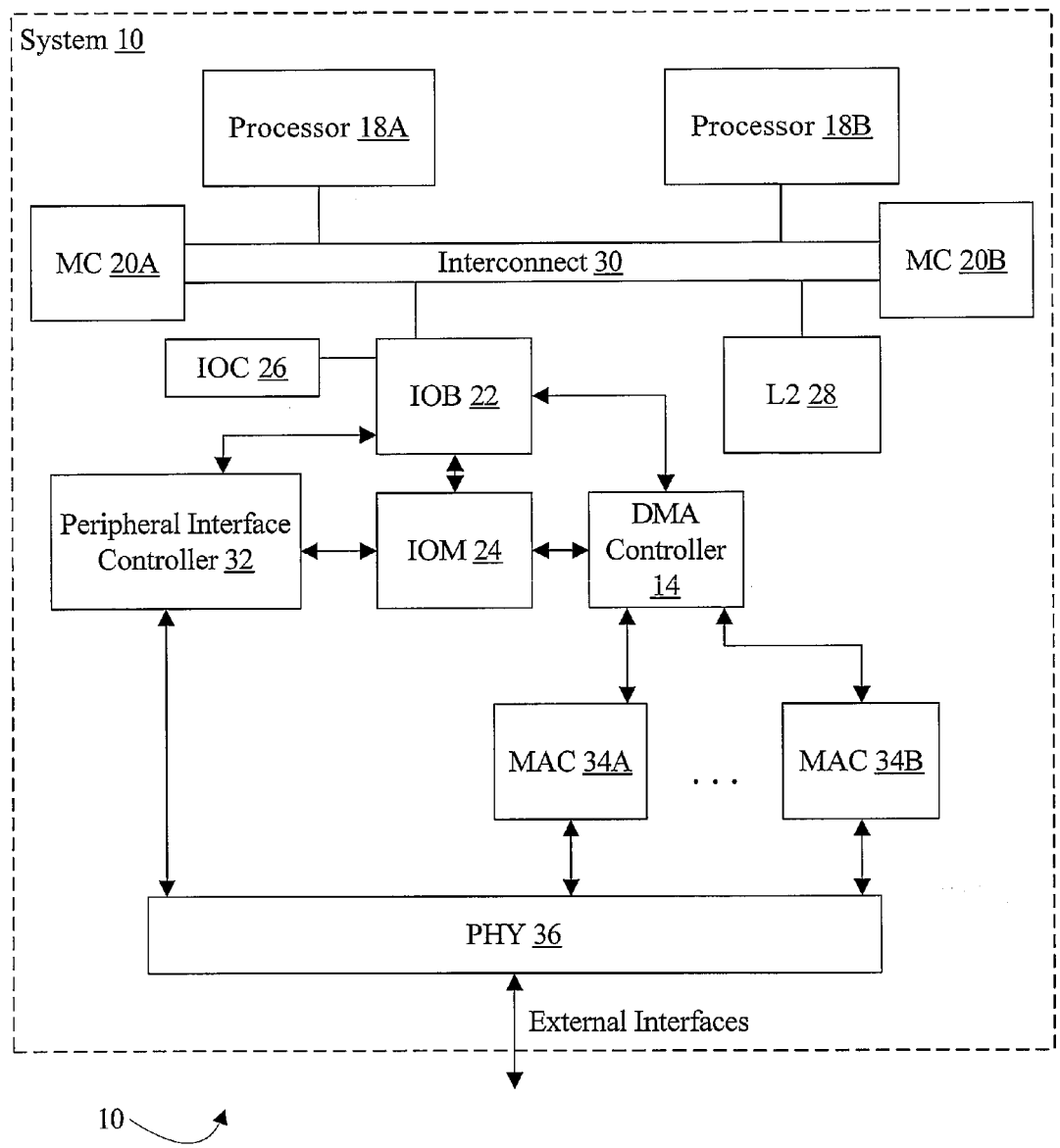
FIG. 1 is a block diagram of one embodiment of a system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Overview

Turning now to FIG. 1, a block diagram of one embodiment of a system 10 is shown. In the illustrated embodiment, the system 10 includes a DMA controller 14, one or more processors such as processors 18A-18B, one or more memory controllers such as memory controllers 20A-20B, an I/O bridge (IOB) 22, an I/O memory (IOM) 24, an I/O cache (IOC) 26, a level 2 (L2) cache 28, an interconnect 30, a peripheral interface controller 32, one or more media access control circuits (MACs) such as MACs 34A-34B, and a physical interface layer (PHY) 36.

The processors 18A-18B, memory controllers 20A-20B, IOB 22, and L2 cache 28 are coupled to the interconnect 30. The IOB 22 is further coupled to the IOC 26 and the IOM 24. The DMA controller 14 is also coupled to the IOB 22 and the IOM 24. The MACs 34A-34B are coupled to the DMA controller 14 and to the physical interface layer 36. The peripheral interface controller 32 is also coupled to the I/O bridge 22 and the I/O memory 34 and to the physical interface layer 36. In some embodiments, the components of the system 10 may be integrated onto a single integrated circuit as a system on a chip. In other embodiments, the system 10 may be implemented as two or more integrated circuits.

The DMA controller 14 is configured to perform DMA transfers between the interface circuits 16 and the host address space. Additionally, the DMA controller 14 may, in some embodiments, be configured to perform DMA transfers between sets of memory locations within the address space (referred to as a "copy DMA transfer").

The DMA controller 14 may also be configured to perform one or more operations (or "functions") on the DMA data as the DMA data is being transferred, in some embodiments. In one embodiment, some of the operations that the DMA controller 14 performs are operations on packet data (e.g. encryption/decryption, cyclical redundancy check (CRC) generation or checking, checksum generation or checking, etc.). The operations may also include an exclusive OR (XOR) operation, which may be used for redundant array of inexpensive disks (RAID) processing, for example.

The processors 18A-18B comprise circuitry to execute instructions defined in an instruction set architecture implemented by the processors 18A-18B. Specifically, one or more programs comprising the instructions may be executed by the processors 18A-18B. Any instruction set architecture may be implemented in various embodiments. For example, the PowerPC™ instruction set architecture may be implemented. Other exemplary instruction set architectures may include the ARM™ instruction set, the MIPS™ instruction set, the SPARC™ instruction set, the x86 instruction set (also referred to as IA-32), the IA-64 instruction set, etc.

The memory controllers 20A-20B comprise circuitry configured to interface to memory. For example, the memory controllers 20A-20B may be configured to interface to dynamic random access memory (DRAM) such as synchronous DRAM (SDRAM), double data rate (DDR) SDRAM, DDR2 SDRAM, Rambus DRAM (RDRAM), etc. The memory controllers 20A-20B may receive read and write transactions for the memory to which they are coupled from the interconnect 30, and may perform the read/write operations to the memory.

The L2 cache 28 may comprise a cache memory configured to cache copies of data corresponding to various memory locations in the memories to which the memory controllers 20A-20B are coupled, for low latency access by the processors 18A-18B and/or other agents on the interconnect 30. The L2 cache 28 may comprise any capacity and configuration (e.g. direct mapped, set associative, etc.).

The IOB 22 comprises circuitry configured to communicate transactions on the interconnect 30 on behalf of the DMA controller 14 and the peripheral interface controller 32. The interconnect 30 may support cache coherency, and the IOB 22 may participate in the coherency and ensure coherency of transactions initiated by the IOB 22. In the illustrated embodiment, the IOB 22 employs the IOC 26 to cache recent transactions initiated by the IOB 22. The IOC 26 may have any capacity and configuration, in various embodiments, and may be coherent. The IOC 26 may be used, e.g., to cache blocks of data which are only partially updated due to reads/writes generated by the DMA controller 14 and the peripheral interface controller 32. Using the IOC 26, read-modify-write sequences may be avoided on the interconnect 30, in some cases. Additionally, transactions on the interconnect 30 may be avoided for a cache hit in the IOC 26 for a read/write generated by the DMA controller 14 or the peripheral interface controller 32 if the IOC 26 has sufficient ownership of the cache block to complete the read/write. Other embodiments may not include the IOC 26.

The IOM 24 may be used as a staging buffer for data being transferred between the IOB 22 and the peripheral interface controller 32 or the DMA controller 14. Thus, the data path between the IOB 22 and the DMA controller 14/peripheral interface controller 32 may be through the IOM 24. The control path (including read/write requests, addresses in the host address space associated with the requests, etc.) may be between the IOB 22 and the DMA controller 14/peripheral interface controller 32 directly. The IOM 24 may not be included in other embodiments.

The interconnect 30 may comprise any communication medium for communicating among the processors 18A-18B, the memory controllers 20A-20B, the L2 cache 28, and the IOB 22. For example, the interconnect 30 may be a bus with coherency support. The interconnect 30 may alternatively be a point-to-point interconnect between the above agents, a packet-based interconnect, or any other interconnect. The interconnect may be coherent, and the protocol for supporting coherency may vary depending on the interconnect type.

The MACs 34A-34B may comprise circuitry implementing the media access controller functionality defined for network interfaces. For example, one or more of the MACs 34A-34B may implement the Gigabit Ethernet standard. One or more of the MACs 34A-34B may implement the 10 Gigabit Ethernet Attachment Unit Interface (XAUI) standard. Other embodiments may implement other Ethernet standards, such as the 10 Megabit or 100 Megabit standards, or any other network standard. In one implementation, there are 6 MACs, 4 of which are Gigabit Ethernet MACs and 2 of which are XAUI MACs. Other embodiments may have more or fewer MACs, and any mix of MAC types.

Among other things, the MACs 34A-34B that implement Ethernet standards may strip off the inter-frame gap (IFG), the preamble, and the start of frame delimiter (SFD) from received packets and may provide the remaining packet data to the DMA controller 14 for DMA to memory. The MACs 34A-34D may be configured to insert the IFG, preamble, and SFD for packets received from the DMA controller 14 as a transmit DMA transfer, and may transmit the packets to the PHY 36 for transmission.

The peripheral interface controller 32 comprises circuitry configured to control a peripheral interface. In one embodiment, the peripheral interface controller 32 may control a peripheral component interconnect (PCI) Express interface. Other embodiments may implement other peripheral interfaces (e.g. PCI, PCI-X, universal serial bus (USB), etc.) in addition to or instead of the PCI Express interface.

The PHY 36 may generally comprise the circuitry configured to physically communicate on the external interfaces to the system 10 under the control of the interface circuits 16. In one particular embodiment, the PHY 36 may comprise a set of serializer/deserializer (SERDES) circuits that may be configured for use as PCI Express lanes or as Ethernet connections. The PHY 36 may include the circuitry that performs 8b/10b encoding/decoding for transmission through the SERDES and synchronization first-in, first-out (FIFO) buffers, and also the circuitry that logically configures the SERDES links for use as PCI Express or Ethernet communication links. In one implementation, the PHY may comprise 24 SERDES that can be configured as PCI Express lanes or Ethernet connections. Any desired number of SERDES may be configured as PCI Express and any desired number may be configured as Ethernet connections.

It is noted that, in various embodiments, the system 10 may include one or any number of any of the elements shown in FIG. 1 (e.g. processors, memory controllers, caches, I/O bridges, DMA controllers, and/or interface circuits, etc.).

Error Detection/Correction and Device Kill

In one embodiment, the system 10 may implement an error correction code that may be used to detect and correct certain data errors and may also be used to detect device failure. In the present embodiment, the memory controllers 20A-20B may implement the code and the device failure detected may be a memory chip failure. There may be multiple memory chips incorporated onto a memory module (e.g. a dual inline memory module, or DIMM), and the device failure detected may be a module failure, in other embodiments. Other embodiments may implement the code on a communication channel (e.g. the interconnect 30) or other memories (e.g. the L2 cache 28, the IOC 26, and/or caches in the processors 18A-18B). In other embodiments, different error correction codes may be used in the caches and/or on the interconnect 30.

Specifically, the error correction code implemented in the memory controllers 20A-20B may be a CRC code. In general, a CRC code having L check bits, where L is an integer greater than one, is based on performing a modulo division. The dividend is the data word multiplied by 2 to the power L, and the divisor is a generator value that is selected for the particular code. The remainder of the division is the check bits. A CRC code detects burst errors of L bits or less, where a burst error is an error in consecutive bits of a data word. The CRC code also detects 1, 2, or 3 bit random errors, and a significant percentage of other multibit random errors in the data word. The data word may be a single transmission of data to/from the memory devices (e.g. DIMMs). In general, there may be N transmissions of M data bits for a block of data transferred on the interconnect 30, which may be a cache block for the L2 cache 28, the IOC 26, and other caches in the system. N and M may each be an integer greater than one. In one particular implementation, a block may be 64 bytes divided into four transmissions of 128 data bits. The transmission of data to/from the memory devices may be referred to as a "beat" of data.

Using the CRC code, certain errors within a given beat may be corrected and other errors detected. In this embodiment, single bit errors are corrected and other errors are detected as uncorrectable. If a correctable error is detected, a syndrome may be generated from the L check bits saved with the M data bits and L additional check bits generated from the M data bits when the data is read. The syndrome may identify which of the M data bits is in error and thus needs to be inverted (or "flipped") to correct the error. While single bit errors are corrected in this embodiment, larger numbers of bit errors may be correctable in other embodiments (e.g. J bit errors, where J is an integer greater than zero). The L check bits saved with the M data bits are read from the memory along with the M data bits.

Additionally, the CRC code may be used to detect a device failure (e.g. a memory chip failure). A given memory chip may have a width, which is the number of bits provided from/to the memory chip in one transfer. Using several memory chips in parallel on a DIMM may provide a wider data width from the DIMM. Since a CRC code detects a burst error of up to L bits, if L is greater than or equal to the width of the device (for at least one supported width), then the CRC code may detect when each bit from the device is in error. In one embodiment, the width is 16 bits and thus L is 16. Widths of 8 bits (or less) may also be supported.

However, some multi bit errors that indicate device failure may alias to a correctable error syndrome (e.g. a single bit error syndrome) in the CRC code, and thus may result in such errors being detected as a correctable error. The aliased "correctable" error would be corrected and passed on as correct data. Since multibit soft errors are relatively rare, such operation may be acceptable for soft errors. However, device failure errors may be overlooked as well. The memory controller 20A-20B may divide the data beat into multiple K bit non-overlapping windows of data, where K may be based on the width of the device for which failure detection is desired (e.g. 16 in this case, and thus there may be 8 non-overlapping windows in the 128 bit beat of data). If a correctable error (e.g. single bit) is detected in the same window for each beat of N beats, then a device failure error may be detected for the device corresponding to that window. The non-overlapping windows may be selected so that the bits expected to come from a given device are all included in the same window. The windows may be non-overlapping fields of consecutive bits in one embodiment.

Figure 2:
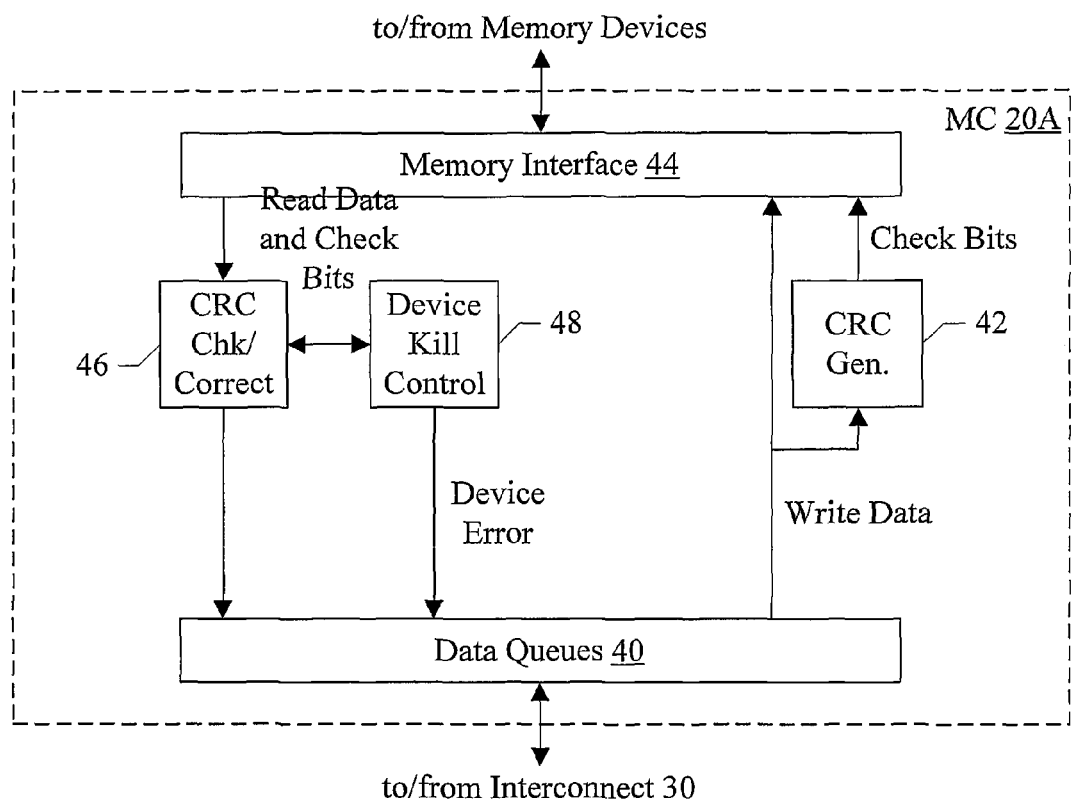
FIG. 2 is a block diagram of one embodiment of a memory controller shown in FIG. 1.

FIG. 2 is a block diagram of one embodiment of a portion of the memory controller 20A is shown. The portion shown in FIG. 2 may comprise the data path for the memory controller 20A. Additional circuitry, not shown, may be used for address and control information. The memory controller 20B may be similar. In the illustrated embodiment, the memory controller 20A includes one or more data queues 40, a CRC generator circuit 42, a memory interface circuit 44, a CRC check/correct circuit 46, and a device control circuit 48. The data queues 40 are configured to store data received from the interconnect 30 (for writes) and from the memory to be transmitted on the interconnect 30 (for reads). A beat of write data is read from the queues 40 and provided to the memory interface 44 to be written to memory, and is also provided to the CRC generator circuit 42. The CRC generator circuit 42 is configured to generate the check bits for the beat, and to provide the check bits to the memory interface to be written to the memory. The memory interface 44 includes the circuitry designed to communicate with one or more memory devices (e.g. DIMMS that may be coupled to the system 10). The memory interface is further coupled to provide a beat of read data to the CRC check/correct circuit 46, which is configured to check the read data for errors (and correct correctable errors). The (possibly corrected) data is provided to the data queues 40 for storage, to be transmitted on the interconnect 30. The device kill control circuit 48 is coupled to the CRC check/correct circuit 46 and is configured to detect and signal device errors. If a device error is detected by the device kill control circuit 48, the device kill control circuit 48 may signal the error, which may be placed in the data queues 40 and may be returned to the requester of the data on the interconnect 30. Similarly, if an uncorrectable error is signalled, the uncorrectable error may be returned to the requestor. Any mechanism may be used to report the error (processor interrupt, signalling an error on the interconnect 30 in an interconnect-specific way, etc.).

Figure 3:
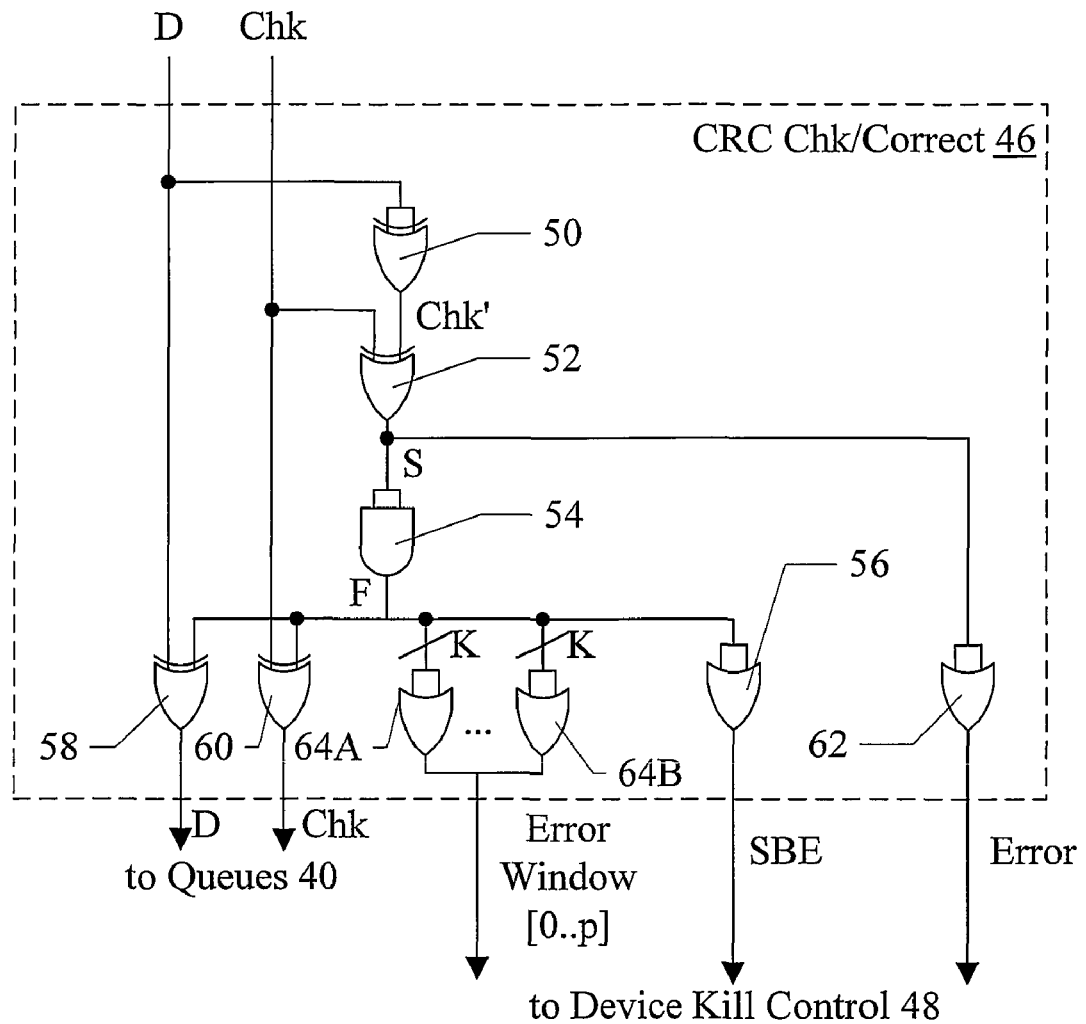
FIG. 3 is a block diagram of one embodiment of a cyclic redundancy code (CRC) check/correct circuit shown in FIG. 2.

Turning next to FIG. 3, a block diagram representing one embodiment of the check/correct circuit 46 is shown. Certain logic gates are shown in FIG. 3 to represent circuitry that performs the check/correction operations, as described below. However, the logic gates are not intended to represent the entirety of the circuitry. Furthermore, alternative circuitry may be used in other embodiments, including Boolean equivalents of the described circuitry. The beat of data (D in FIG. 3) and the corresponding check bits (Chk in FIG. 3) are shown.

The CRC check/correct circuit 46 may generate a new set of check bits (Chk' in FIG. 3) to compare to the check bits read from memory. The circuitry to perform the generation is represented as exclusive-OR (XOR) gate 50, and the circuitry performing the generation may be the same as the CRC generation circuit 42. Generally, a set of XOR gates (or equivalent logical function) may receive the data bits that are covered by a given check bit, and may XOR those bits to generate the given check bit. Thus, there is a "tree" of XOR gates for each check bit. Which data bits are covered by a given check bit varies from embodiment to embodiment, based on the definition of the generator value. A given generator value may be transformed into a matrix that has a number of columns equal to the number of data bits in the beat and a number of rows equal to the number of check bits. A matrix multiplication of the matrix and the data bits (represented as a vector) results in the check bits. The matrix multiplication is performed in hardware by XORing data bits for which a corresponding bit position in the row of the matrix is set to produce the corresponding check bit.

The generated check bits (Chk') are compared to the check bits read from memory (Chk), represented by XOR gate 52. The comparison may be 16 parallel XORs of the check bits in corresponding bit positions. The resulting vector (S) has a binary one for any check bits that are not the same between Chk and Chk'. If S is zero, no errors are detected.

If S is non-zero, it is referred to as a syndrome, and it indicates the detection of an error. Certain syndrome values are indicative of a single bit error in either the data or the check bits. That is, a change to one bit in the data or the check bits, and no other changes, results in binary ones in S for each check bit that covers the changed bit. Those specific syndrome values (144 in one embodiment, for 128 bit data bits and 16 check bits per beat) may be detected and may be used to generate a flip vector (F). For a single bit error, the F vector may have one set bit. By bitwise XORing the F vector with the data and check bits, the bit in error is flipped to its correct state and the error is corrected (represented by XOR gates 58 and 60, although there may be one XOR gate for each data bit and check bit, XORing that data bit and the corresponding bit of the F vector). Generation of the F vector is represented by AND gate 54 in FIG. 3. There may be and AND gate for each possible single bit error syndrome, decoding the S vector for that syndrome. Each bit of the vector S is input to each AND gate (some inverted, some not inverted, depending on the specific syndrome value being decoded).

The bits of the F vector may be logically ORed to indicate a single bit error (indicated as OR gate 56, generating the single bit error signal in FIG. 3). Other non-zero syndromes indicate a multibit error (a non-correctable error in this embodiment). That is, each non-zero value of S indicates that an error has been detected. Accordingly, the bits of the S vector may be logically ORed to indicate any error (represented by OR gate 62). If the error signal is asserted and the SBE signal is not asserted, a non-correctable error has been detected.

In addition to correcting the single bit errors and detecting other errors, the CRC check/control circuit 46 may generate an error signal for each K bit non-overlapping window, indicating the detection of a single bit error in the window. Since some multi-bit errors (which may be indicative of a device failure) alias to single bit errors (by generating the same syndrome S as the single bit error), it is possible that repeated single bit errors in the same window are indicating a device failure. A corresponding error signal for each window (represented in FIG. 3 collectively as Error Window [0 . . . p], where there are p+1 windows in the data beat) is generated by logically ORing the K bits of the vector F that represent the window (illustrated by OR gates 64A and 64B, for example, for two of the windows). It is noted that the OR gates 64A and 64B may be incorporated into the OR logic represented by gate 56, in one embodiment.

The Error Window [0 . . . p] signals, the SBE signal, and the error signal may be provided to the device kill control circuit 48 to detect device failures. In one embodiment, a multibit error may be treated as a device failure. Alternatively, a syndrome that indicates that all bits in a window are incorrect may be treated as a device failure, and other multibit errors may be treated as uncorrectable errors. Logic to detect the specific syndromes that indicate all bits in a window are incorrect may be implemented in such an embodiment.

Figure 4:
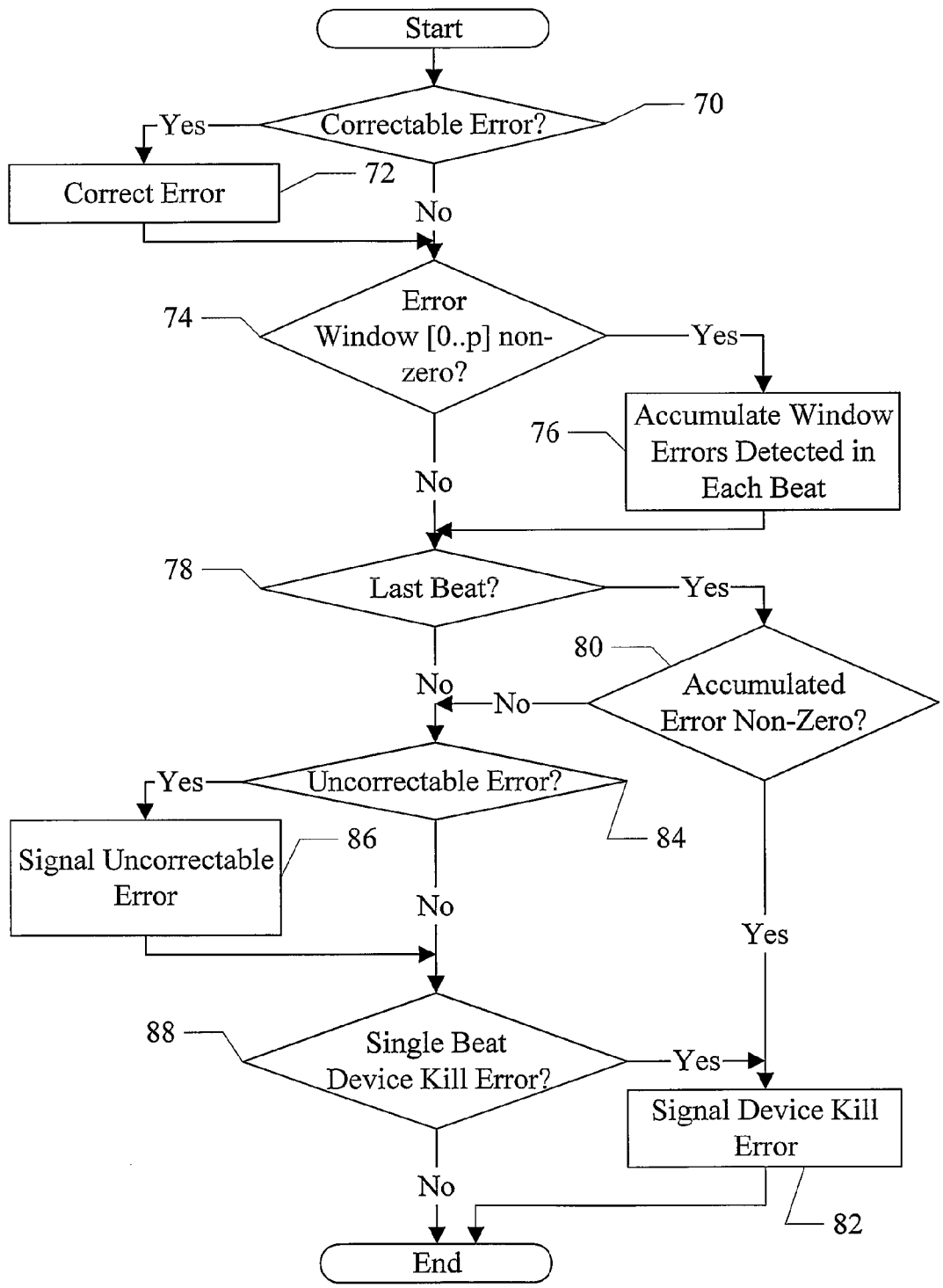
FIG. 4 is a flowchart illustrating one embodiment of the operation of a control unit shown in FIG. 1.

Turning now to FIG. 4, a flowchart illustrating operation of one embodiment of a memory controller 20A-20B (and more specifically the CRC check/correct circuit 46 and the device kill control circuit 48, in the embodiment of FIG. 3) is shown. The blocks are shown in a particular order for ease of understanding, but other orders may be used. Blocks may be performed in parallel in combinatorial logic within the circuits 46 and 48. Blocks, combinations of blocks, and/or the flowchart as a whole may be pipelined over multiple clock cycles.

If the CRC check/correct circuit 46 detects a correctable error (e.g. a single bit error) (decision block 70, "yes" leg), the CRC check/correct circuit 46 may correct the error (block 72). Additionally, the CRC check/correct circuit 46 may signal a correctable error (e.g. asserting the SBE and error signals shown in FIG. 3). The CRC check/correct circuit 46 generates the Error Window signals, and if at least one signal is asserted (the error window signals are non-zero—decision block 74, "yes" leg), the device kill control circuit 48 may accumulate the window errors detected in each beat of data (block 76). For example, the device kill control circuit 48 may maintain an accumulated error bit for each window, which may indicate error when set and no error when clear. Other embodiments may use the opposite meanings for the set and clear states or may track the accumulated errors in other ways. A given accumulated error bit may only indicate error if a correctable error has been signalled for the corresponding window for each beat of a block read. Thus, the accumulated error bit for a given window may be set (indicating error) if the corresponding error window signal is asserted and either the accumulated error bit is already set or this is the first beat of the transfer. The accumulated error bit may be cleared otherwise.

If the current data beat is the last beat of the block read (decision block 78, "yes" leg), and the accumulated error is non-zero (that is, at least one accumulated error bit is set—decision block 80, "yes" leg), the device kill control circuit 48 may signal a device kill error (block 82). That is, a device failure is detected for the device(s) that correspond to the set accumulated error bit(s). Accordingly, a device failure error that aliases to a syndrome indicating a correctable error may be detected. If the current data beat is the last beat of the block read (decision block 78, "yes" leg) but the accumulated error is zero (decision block 80, "yes" leg), then a device failure is not detected. In either case, the device kill control circuit 48 may clear the accumulated error bits since the last beat has been received.

If an uncorrectable error is detected (decision block 84, "yes" leg), the device kill control circuit 48 may signal an uncorrectable error (block 86). For example, the error signal may be asserted and the SBE signal may be deasserted, in FIG. 3, to indicate the uncorrectable error. Additionally, in this embodiment, a single beat device kill error may be detected, as mentioned above. If such an error is detected, the device kill control circuit 48 may signal the device kill error (block 82). If a device kill error is signalled, one embodiment may also identify the device(s) for which device failure has been detected.

FIG. 5 is a table illustrating an exemplary definition of one embodiment of the CRC code for 128 bit beats and 16 check bits. Each row in the table is a hexadecimal number that defines which of the 128 bits is included in the XOR tree that generates the corresponding one of the check bits. Viewed in another way, if the table were viewed as a matrix and the data beat were viewed as a single column matrix, the matrix multiplication of the two would result in a single column matrix containing the check bits for the data.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a check/correct circuit coupled to receive a block of data and corresponding check bits, wherein the block of data and corresponding check bits are received as N transmissions of bits, wherein the bits received in a given transmission comprise M data bits and L check bits, and wherein the M data bits of the given transmission are divided into a plurality of non-overlapping windows of K bits, and wherein the check/correct circuit is configured to detect one or more errors in the plurality of non-overlapping windows responsive to the M data bits and the L check bits; and
   a control circuit coupled to the check/correct circuit, wherein the control circuit is configured to record which of the plurality of windows have had errors detected by the check/correct circuit, and wherein the control circuit is configured to detect that a given window of the plurality of windows has had errors detected in each of the N transmissions of data bits corresponding to the block, and wherein the control circuit is configured to signal a device failure for a device corresponding to the given window responsive to detecting that the given window has had errors detected in each of the N transmissions;
   wherein K, L, M, and N are each integers greater than one, and wherein the errors recorded by the control circuit are errors of J bits or less, wherein J is an integer greater than zero, and wherein a J bit error is correctable, and wherein the check/correct circuit is configured to correct the error in the received data and forward the corrected data.

2. The apparatus as recited in claim 1 wherein a J+1 or greater bit error is not correctable, and wherein the uncorrectable error is signalled.

3. The apparatus as recited in claim 1 wherein J is equal to one.

4. The apparatus as recited in claim 1 wherein the error check/correct circuit is configured to detect a K bit error in the given window, and wherein the control circuit is configured to signal the device failure responsive to the K bit error.

5. The apparatus as recited in claim 1 wherein the check bits are generated according to a cyclic redundancy code.

6. The apparatus as recited in claim 5 wherein L is equal to K.

7. The apparatus as recited in claim 1 wherein K is the width of the device for which the device failure is detectable, for at least one supported width of the device.

8. The apparatus as recited in claim 7 wherein the device is a memory chip.

9. A method comprising:
   receiving a block of data and corresponding check bits as N transmissions of bits, wherein the bits received in a given transmission comprise M data bits and L check bits, wherein the M data bits are divided into a plurality of non-overlapping windows of K bits;
   detecting one or more errors in the plurality of non-overlapping windows of K bits responsive to the M data bits and the L check bits;
   recording which of the plurality of windows have had errors detected in each of the N transmissions;
   detecting that a given window of the plurality of windows has had errors in each of the N transmissions of bits corresponding to the block of data; and
   signalling a device failure responsive to detecting that the given window has had errors in each of the N transmissions, wherein the device failure is signalled for a device corresponding to the given window;
   wherein K, L, M, and N are each integers greater than one, and wherein the recorded errors are errors of J bits or less, wherein J is an integer greater than zero, and wherein a J bit error is correctable, and wherein the method further comprises correcting the error in the received data and forwarding the corrected data.

10. The method as recited in claim 9 wherein a J+1 or greater bit error is not correctable, and the method further comprises signalling the uncorrectable error.

11. The method as recited in claim 9 wherein J is equal to one.

12. The method as recited in claim 9 further comprising detecting a K bit error in the given window; and signalling the device failure responsive to the K bit error.

13. The method as recited in claim 9 further comprising generating the check bits according to a cyclic redundancy code.

14. The method as recited in claim 13 wherein L is equal to K.

15. The method as recited in claim 9 wherein K is the width of the device for which the device failure is detectable, for at least one supported width of the device.

16. The method as recited in claim 15 wherein the device is a memory chip.

* * * * *